United States Patent [19]
Fagnani et al.

[11] Patent Number: 5,532,645
[45] Date of Patent: Jul. 2, 1996

[54] CIRCUIT FOR CONTROLLING THE RISE OF THE OUTPUT VOLTAGE OF AN AMPLIFIER AT START UP

[75] Inventors: Mauro Fagnani, Nerviano; Bruno Ferrario, Fino Mornasco; Paolo Sandri, Milan, all of Italy

[73] Assignee: SGS-Thomson Microelectronics, S.r.l., Agrate Brianza, Italy

[21] Appl. No.: 328,233

[22] Filed: Oct. 24, 1994

[30] Foreign Application Priority Data

Oct. 22, 1993 [IT] Italy .................. VA93A0023

[51] Int. Cl.⁶ ............................................. H03P 3/26
[52] U.S. Cl. ............................................. 330/265; 330/267
[58] Field of Search ................... 323/313, 314, 323/315, 316; 330/255, 263, 265, 267, 288

[56] References Cited

U.S. PATENT DOCUMENTS 3,766,410  10/1973  Elsaesser ................... 330/265 X
3,995,228  11/1976  Pass ............................. 330/265
4,453,193   6/1984  Huang et al. .................. 361/98
5,148,115   9/1992  Koakutsu et al. ............... 330/2

FOREIGN PATENT DOCUMENTS 0281117  12/1990  European Pat. Off. .
WO94/01928  1/1994  WIPO .

*Primary Examiner*—Steven Mottola
*Attorney, Agent, or Firm*—Robert Groover; Betty Formby

[57] ABSTRACT

A circuit for regulating the charging time of the output node of an amplifier at start up. The output node commonly comprises an external soft-start capacitor charged by a current delivered by a pull-up transistor of a push-pull output stage of the amplifier, through a decoupling diode that is functionally connected between the output node of the amplifier and a terminal of the external soft-start capacitor. The present application provides a current mirror feed back circuit capable of mirroring the charge current of the external soft-start capacitor onto the driving node of the pull-up transistor of the output stage of the amplifier. The regulating circuit permits use of an external capacitance of extremely small size. Upon the reaching of a fully charged condition by the external capacitor, the control circuit self-isolates and does not influence in any way the normal operation of the amplifier.

22 Claims, 2 Drawing Sheets

5,532,645

CIRCUIT FOR CONTROLLING THE RISE OF THE OUTPUT VOLTAGE OF AN AMPLIFIER AT START UP

CROSS-REFERENCE TO RELATED APPLICATION

This application claims priority from Italian app'n VA/93/A/0023, filed Oct. 22, 1993, which is hereby incorporated by reference.

BACKGROUND AND SUMMARY OF THE INVENTION

The present invention relates to differential amplifiers, especially error amplifiers, used in control and regulation systems, where it is necessary or useful to control, at the time power is applied, the rise of the voltage on the output node of the amplifier toward the supply voltage, through the charging of capacitances associated with the output node. This is important, e.g. in DC-to-DC converters, to avoid overvoltage of the regulated output voltage during the start-up phase, and in positioning motors.

In control and regulation systems, differential amplifiers (error amplifiers) are widely used which have an output stage composed of a pair of transistors functioning in a push-pull mode (for example a "pull-up" transistor connected between the output node and the supply rail and a "push-down" transistor connected between the output node and ground) and in which the output node is often connected directly to the input of a comparator. At start up, an out-of-balance condition of the inputs of the amplifier may cause a sudden saturation rise of the output node toward the supply voltage. A steep rising of the output voltage toward the supply may cause undesired over-shoot phenomena of the parameter value controlled by the regulating system.

Known solutions generally consist in slowing the voltage rise at the output node at start up, either by introducing a circuit device for controlling the voltage rise (slew rate) on an internal driving node of the amplifier or on the output node itself, for example by tying the output node voltage to the voltage of a so-called "soft-start" capacitance which is charged with a constant current.

In many applications, especially in case of error amplifiers, the introduction of such a device within the inner core circuit of the amplifier may present remarkable difficulties, since a few millivolts may be sufficient to completely unbalance the output stage of the amplifier. In these cases, control of the rise time of the voltage at the output node must necessarily be effected at the output node itself without altering the core of the amplifier.

A known solution is based on the use of a diode or a PNP transistor with an emitter connected to the output node, a collector connected to a common ground node of the amplifier and a base connected to the armature of an external "soft-start" capacitor. The external soft-start capacitor may be charged through a charge path that is functionally external to the structure of the amplifier. The PNP transistor prevents a too steep rise of the voltage on the output node of the amplifier.

This known solution has several drawbacks and limitations. There is in fact a constant tendency to reduce as much as possible the size of the external components, such as the soft-start capacitor, as well as of minimizing current absorption. The use of a diode or a PNP transistor, intrinsically capable of producing a "base" current in the order of milliamperes, may often be incompatible with a soft-start capacitor requiring a charge current of few milliamperes. In other words, the base current of the transistor may represent per se an excessive contribution to the charge current of a soft-start capacitor, which for other reasons should be as small as possible.

To solve these difficulties and drawbacks, the present application advantageously provides a control circuit capable of tying the output voltage of an amplifier, by employing an external soft-start capacitor of small size while keeping the total charge current of the external soft-start capacitance, in the order of microampers.

Basically, the circuit of the invention implements a feedback that controls the driving level of the pull-up transistor in the amplifier's output stage, which transistor outputs the charge current of the soft-start capacitor, in order to limit the charge current delivered through a diode to the external capacitor connected to the dedicated "soft-start" pin of the integrated device, thus implementing a gradual rise of the output voltage.

The feedback loop consists essentially of a complementary pair of current mirrors, through which the charge current that flows through the charge diode to the external soft-start capacitor is "mirrored", in a suitable ratio, on the base of the same transistor of the push-pull output stage of the amplifier that delivers the charge current, in order to partially reduce its drive conditions.

Within the control loop, a certain current balance is achieved such that the current forced by the respective bias current generator of the output transistor that delivers the charge current of the output node, is counterbalanced, at least partially, by a current that is a function of the effective charge current, and which is fed to the base of the transistor through the current mirror of the feedback circuit of the invention.

Therefore, the output node gradually charges itself toward the supply voltage.

An auxiliary current generator may be employed for ensuring a complete charge of the external soft-start capacitor when, at start up, the output node of the amplifier stabilizes itself at a certain level imposed by the regulating chain of which the amplifier is part.

In any case, upon the reaching of a fully charged state by the external soft-start capacitor, the charge diode (which is part of the first current mirror) cuts itself off, thus isolating in practice the control soft start circuit from the functional circuit of the amplifier.

BRIEF DESCRIPTION OF THE DRAWING

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

Figure 1:
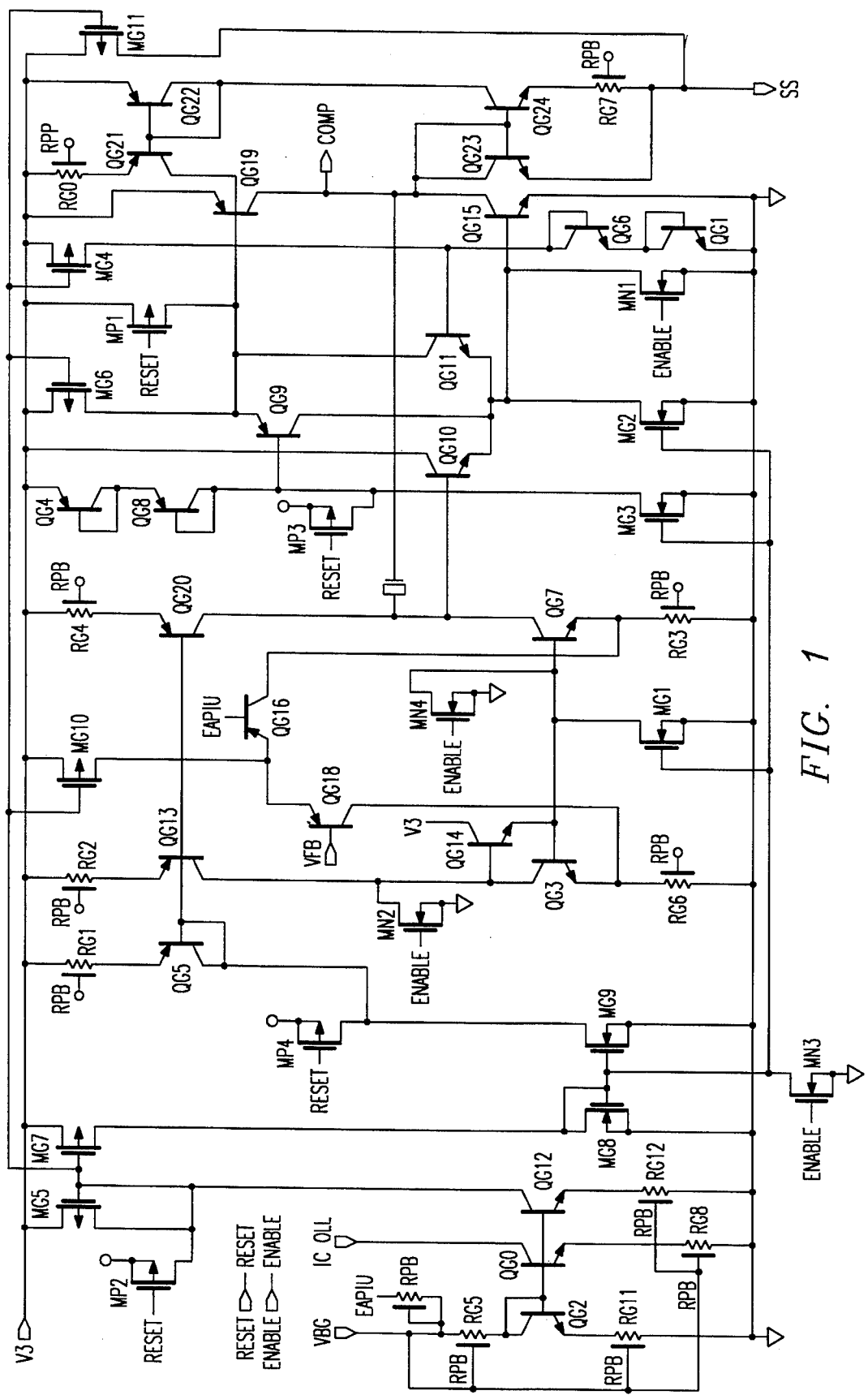
FIG. 1 shows a sample circuit implementation of the disclosed innovations.

The numerous innovative teachings of the present application will be described with particular reference to the presently preferred embodiment (by way of example, and not of limitation), in which:

The different aspects and advantages of the control circuit of the invention will become more evident through the following description of an important embodiment, herein incorporated by express reference, and by referring to the attached drawing showing the circuit diagram of an error amplifier, provided with a circuit to control the rise of the output voltage at start up, according to the present invention.

The circuit of the attached figure represents a differential error amplifier, powered with a supply voltage V3 and comprising an output stage composed of a complementary pair of push-pull transistors QG19 and QG15, which have their respective collector connected in common to the output node COMP of the amplifier. The current generator MG2 provides a correct bias of the complementary pair of output transistors. As will be evident, the inner structure of the amplifier can be considered substantially irrelevant and a detailed description thereof is superfluous in the present context.

The circuit controlling the rising of the voltage on the output node COMP, at start up, comprises the external soft-start capacitor CSS, connected to a dedicated SS pin of the integrated circuit, a diode-configured transistor QG23, and, according to the shown embodiment of the invention, the transistors QG24, QG22, QG21, the resistances RG7, RG0, and the transistor MG11.

At start up, the capacitance CSS is completely discharged and the pull-up transistor QG19 of the output push-pull stage of the amplifier tends to deliver the maximum current (that is to saturate) to bring its collector (output node COMP) to the supply voltage V3. The current of QG19, through the diode QG23, charges the external capacitor CSS.

According to a first aspect of the circuit of the invention, the current that flows through the charge diode QG23 is mirrored on QG24 and, through a second current mirror formed by the pair of transistors QG21 and QG22, complementary to the first mirror, constituted by the pair QG23 and QG24, a current proportional to the charge current that flows through the diode QG23, and suitably reduced by employing an appropriate mirror ratio, is delivered to the base of the output transistor QG19. The current delivered to the base of the output transistor QG19 partially compensates the drive conditions that otherwise would cause saturation of the transistor QG19, at start up of the circuit of the amplifier. In other words, the fractional current mirrored on the base node of QG19 partially counterbalances the charge current forced by the respective bias generator MG2.

Note that in current mirrors QG23/24 and QG22/21, the transistors all appear to have equal areas. However, the resistors RG0 and RG7 define the effective mirror ratios.

Practically, the current balance achieved in the control loop provides for a substantial amount (I) of the total current 3I, required by the bias generator MG2, to be supplied by the transistor QG21 of the second current mirror of the circuit.

The control loop is capable of maintaining the total charge current of the external soft-start capacitor CSS connected to the relative SS pin, within a maximum value on the order of about ten microAmperes (µA). Therefore, the circuit is capable of ensuring a gradual rise of the voltage on the output voltage COMP from about 0.7 V up to the supply voltage V3, in a strictly controlled and externally programmable mode. According to another aspect of the circuit of the invention, an auxiliary current generator MG11, capable of delivering a current of a fractional value of the charge current level of the external soft-start capacitor CSS, may be advantageously employed for ensuring a complete charge of the CSS capacitor, also in case the output voltage COMP stabilizes on a certain value, imposed by the regulating chain of which the error amplifier may be part, at start up.

When the CSS capacitor is full charged, the diode QG23 ceases to conduct, thus practically isolating the above described control circuit from the functional circuit of the amplifier.

In a sample embodiment, the external capacitor CSS is about 2.2 µF, the charging current $I_{soft\ start}$=40 µA, and the resulting duration of the "soft start" ramp-up time $T_{soft\ start}$≈126 msec. However, of course these numbers can readily be changed for different implementations or different applications.

VBG is a fixed, temperature independent voltage, e.g. from a (Widlar) bandgap voltage reference.

ICOLL is another current used to supply other stages of the IC, not involved with the soft start function.

Figure 2:
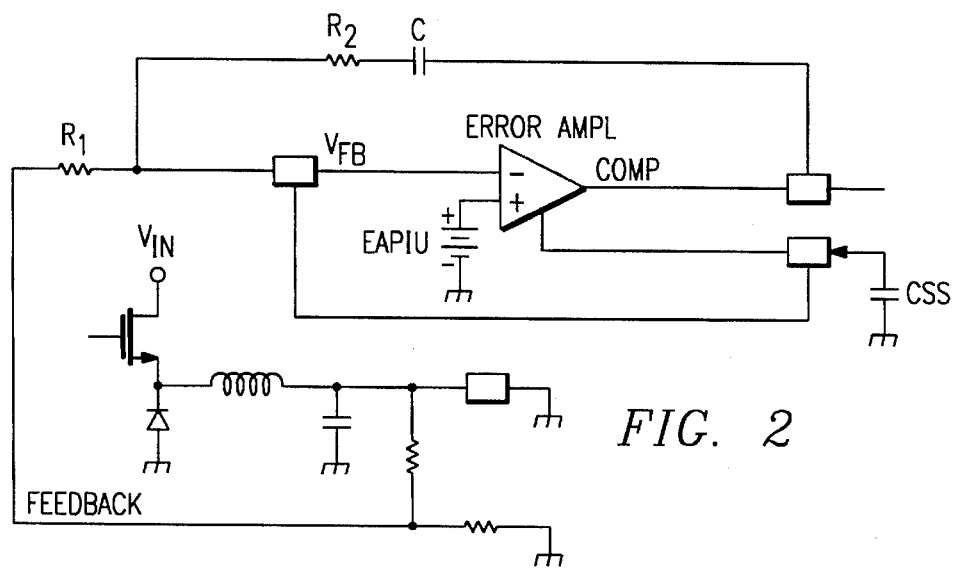
FIG. 2 is a high-level block diagram of a DC—DC converter chip which incorporates the innovative soft-start function and circuit described above.

VFB and EAPIU (connected to bases of Q18 and Q16 respectively) are the error amplifier inputs as shown in FIG. 2 below.

The control circuit of the invention achieves all the stated objectives. In practice, it makes it possible to control extremely small charge currents, in the order of few ten microamperes (µA), which permits the use of external soft-start capacitors of extremely low value. On the other hand, the functional circuit of the amplifier is not altered in any way and therefore undesired interferences of the soft-start control circuit with the normal operation of the amplifier are positively excluded.

FIG. 2 is a high-level block diagram of a DC—DC converter chip which incorporates the innovative soft-start function and circuit described above. This generally corresponds to the L4985 Double DC—DC Converter from SGS-Thomson; this part and its data sheet are both hereby incorporated by reference.

Notable features of this part include: a 3 A step down converter; auxiliary flyback output able to deliver 5 W at VS=12 V; gate driver for synchronous rectifier; optimized efficiency with nominal and minimum load current; precise 1.28 V (±2%) reference voltage; switching frequency to 100 KHz; disable inputs for zero current consumption; internal current limit; soft start function; reset function; thermal shutdown; and availability in modified DIP packages (Powerdip 20 and SO290L).

This double DC—DC converter is a monolithic device developed to generate all the voltages required in multioutput DC—DC converters, in particularly when the supply voltage is a battery, and isolation is not needed. This device is designed to start to operate at an input voltage as low as 4.5 V up to 18 V. The chip uses BCD technology, in which bipolar, CMOS, and power DMOS device technologies are combined. The chip can deliver 3 A to the load on the stepdown section, and can manage 1 A peak current on the open drain section.

Due to the very high efficiency of this double regulator, the chip is available in plastic dual in line packages (Powerdip 20 for standard assembly, and SO20L for SMD assembly).

The chip includes two major sections: one section is a stepdown regulator, and the other one is a flexible regulator with open drain output DMOS transistor, source grounded, for flyback topology for multiple outputs or for step-up topology when a supply higher than the supply one is requested.

The stepdown section, delivering up to 3 A load current, at an output voltage adjustable from 1.28 V up to 16 V, operates in voltage mode, at a fixed frequency, with no limitation on the max duty cycle.

An internal step-up converter provides gate overdrive voltage for the internal N-channel DMOS transistor, to achieve 0.1Ω typical $R_{dson}$. This step-up converter also provides gate overdrive voltage for the driver of an external DMOS transistor (as long as the external transistor requires no more than 30 nC of gate charge, at 100 KHz).

This pin can be left open if the use of a Schottky diode is preferred. A small chip inductor and a filter capacitor is needed for the internal step-up. This section, in particular, has been designed to maximize the efficiency in all possible working conditions: in presence of max load current because the very low $R_{dson}$, low quiescent current, and a switching frequency limited at 100 KHz max, and in presence of minimum load due to the intervention of the burst mode operation.

An internal limiting current limits the max current delivered to the load. A reset block, monitoring the feedback voltage, with programmable reset delay time, will generate a reset signal for the microprocessor. The reset output is an open drain.

Moreover, the DIS1 pin, active low, will inhibit the whole device, reducing to zero the current consumption from the battery.

The second section is a low power converter, capable to deliver a global output power in excess of 5 W. (The maximum power depends on the topology, which may be flyback discontinuous using a transformer for multioutput or step-up for single output, on the supply voltage value, and on the power dissipation of the stepdown section.)

The open drain power MOS has an $R_{dson}$ of 1Ω typical and a max voltage breakdown of 50 V. This means that the supply voltage for this auxiliary converter is not limited to 20 V, but can be higher, depending on the topology used, and can be separate from the supply voltage of the stepdown section.

For this section, very few components are required; basically, a voltage divider only to fix the output voltage. The oscillator is internal, in common with the stepdown section, and the compensation is internal. The DIS2 pin, when low, will inhibit this section, reducing the quiescent current consumption from the supply voltage.

Figure 3:
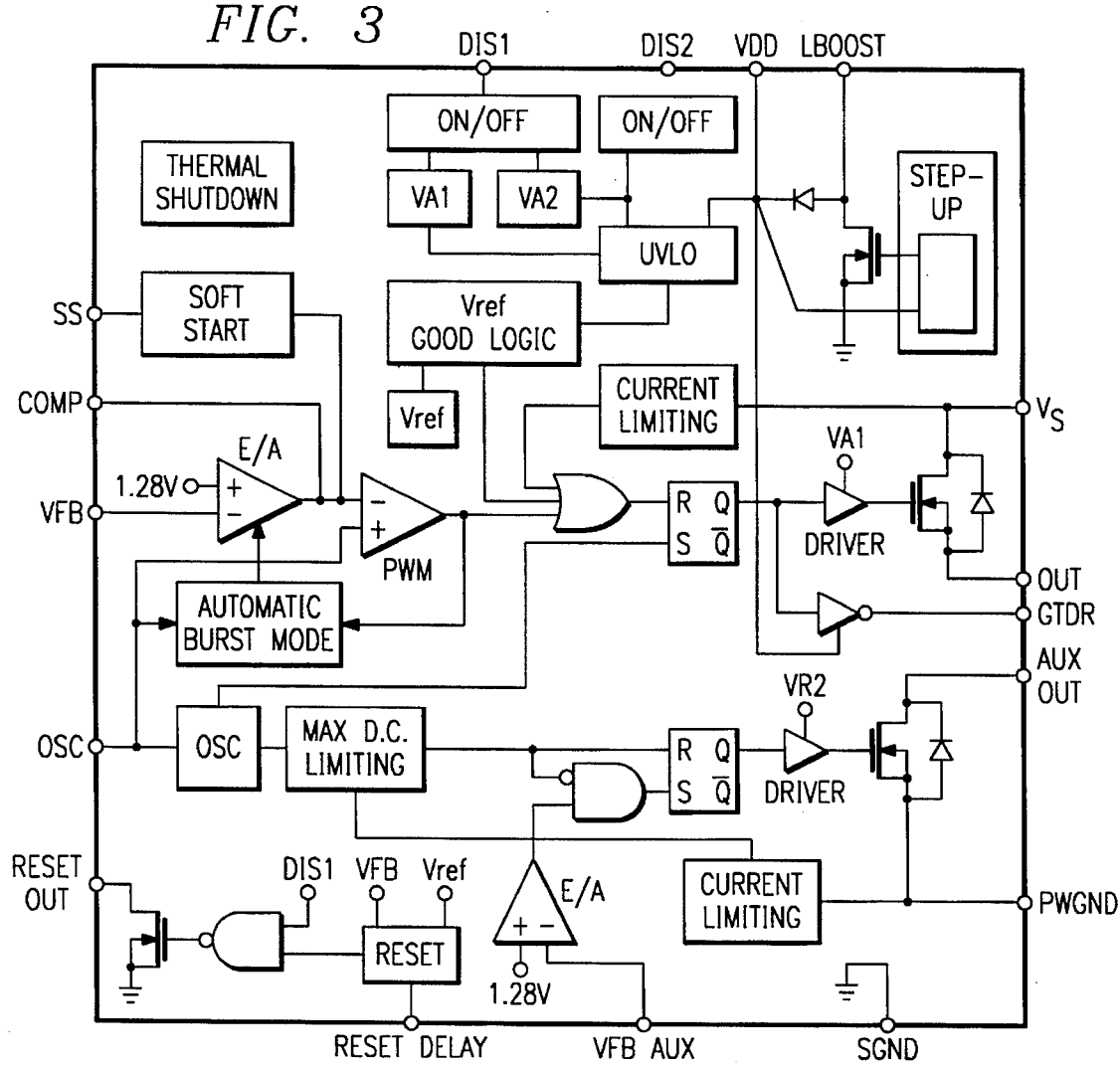
FIG. 3 schematically shows how connections can be made to implement the soft-start functionality, in a sample embodiment.

FIG. 3 schematically shows how connections can be made to implement the soft-start functionality, in a sample embodiment like that of FIG. 2.

The "soft start" capability is useful in DC—DC converters to avoid overvoltage on the regulated output voltage during the start-up phase. It is also useful for control of positioning motors.

According to a disclosed class of innovative embodiments, there is provided: an amplifier circuit, comprising: one or more amplifier stages; an output stage, operatively connected to be controlled by said amplifier stages, and comprising the series combination of a pull-up transistor and a pull-down transistor connected to drive an output node therebetween; a connection for an integrating capacitor, separated from said output node by a diode; and a negative feedback circuit, operatively connected to mirror the current charging said capacitor to limit the current provided by said pull-up transistor when said capacitor is discharged.

According to another disclosed class of innovative embodiments, there is provided: A circuit for regulating the charge of the output node of an amplifier at start up, comprising an external capacitor that is chargeable by a current delivered by a pull-up transistor of a push-pull output stage of the amplifier, through a diode functionally connected between the output node of the amplifier and a terminal of said external capacitor, and means for mirroring a current function of the current delivered through said charge diode to the external capacitor on the driving node of said pull-up transistor of the output stage of the amplifier.

According to another disclosed class of innovative embodiments, there is provided: A method for operating an amplifier circuit, comprising the steps of: amplifying an input signal in one or more stages, to thereby drive an output stage comprising the series combination of a pull-up transistor and a pull-down transistor connected to drive an output node therebetween; charging an integrating capacitor through a diode connection from said output node; and mirroring the charging current of said capacitor, and accordingly limiting the current provided by said pull-up transistor at times when said capacitor is discharged, but not at times when said capacitor is fully charged.

According to another disclosed class of innovative embodiments, there is provided: An integrated circuit, comprising: an output stage, operatively connected to be controlled by said amplifier stages, and comprising the series combination of a pull-up transistor and a pull-down transistor connected to drive an output node therebetween; a voltage-increasing stage, connected to generate an increased voltage output from a power supply input; a connection for an integrating capacitor, separated from said output node by a diode, and operatively connected to said increased voltage from said voltage-increasing stage; and a negative feedback circuit, operatively connected to mirror the current charging said integrating capacitor to limit the current provided by said pull-up transistor when said capacitor is discharged.

As will be recognized by those skilled in the art, the innovative concepts described in the present application can be modified and varied over a tremendous range of applications, and accordingly the scope of patented subject matter is not limited by any of the specific exemplary teachings given. For example, as shown above, this can be implemented in a buck converter as well as a boosting converter, and the circuit implementations can be varied in a tremendous variety of ways.

Alternatively, the disclosed inventions can also be implemented with a very large on-chip capacitor, or with a capacitor in the same package as the chip.

Alternatively, the disclosed soft-start functionality can also be implemented with an external power transistor, or even with the transistor and output diode both provided as external discrete elements.

What is claimed is:

1. An amplifier circuit, comprising:

one or more amplifier stages;

an output stage, operatively connected to be controlled by said amplifier stages, and comprising the series combination of a pull-up transistor and a pull-down transistor connected to drive an output node therebetween;

a connection for an integrating capacitor, separated from said output node by a diode; and a negative feedback circuit, operatively connected to mirror the current charging said capacitor and thereby to limit the current provided by said pull-up transistor when said capacitor is discharged.

2. The circuit of claim 1, wherein said negative feedback circuit mirrors the current charging said capacitor to provide a current contribution to the base current of said pull-up transistor.

3. The circuit of claim 1, wherein said integrating capacitor is not integrated with said pull-up and pull-down transistors.

4. The circuit of claim 1, wherein said pull-up and pull-down transistors are both bipolar.

5. The circuit of claim 1, wherein said pull-up transistor is PNP and said pull-down transistor is NPN.

6. A circuit for regulating the charge of the output node of an amplifier at start up, comprising an external capacitor that is chargeable by a charging current delivered by a pull-up transistor of a push-pull output stage of the amplifier, through a diode functionally connected between the output node of the amplifier and a terminal of said external capacitor, and means for mirroring a current, which is a function of said charging current, onto a control terminal of said pull-up transistor of the output stage of the amplifier, to thereby limit the current provided by said pull-up transistor when said capacitor is discharged.

7. A regulating circuit as defined in claim 6, wherein an auxiliary charge current generator is functionally connected between a supply node and said external capacitor for completing and maintaining the charge of the capacitor at the supply voltage during normal operation of the amplifier.

8. A regulating circuit as defined in claim 6, wherein said means comprise a complementary pair of current mirrors, said charge diode forming part of a first current mirror of said complementary pair of current mirrors.

9. A regulating circuit according to claim 7, wherein said auxiliary generator delivers a current of a fraction of the charge current that is delivered by said transistor of the output stage of the amplifier.

10. A method for operating an amplifier circuit, comprising the steps of:

(a.) amplifying an input signal in one or more stages, to thereby drive an output stage comprising the series combination of a pull-up transistor and a pull-down transistor connected to drive an output node therebetween;

(b.) charging an integrating capacitor through a diode connection from said output node; and (c.) mirroring the charging current of said capacitor, and accordingly limiting the current provided by said pull-up transistor at times when said capacitor is discharged, but not at times when said capacitor is fully charged.

11. The method of claim 10, wherein said integrating capacitor is not integrated with said pull-up and pull-down transistors.

12. The method of claim 10, wherein said stages of said amplifying step are differential.

13. The method of claim 10, wherein said pull-up transistor is PNP and said pull-down transistor is NPN.

14. The method of claim 10, wherein said pull-up transistor is bipolar, and said mirroring step mirrors the charging current of said capacitor to provide a current contribution to the base current of said pull-up transistor.

15. The method of claim 10, wherein said pull-up and pull-down transistors are both bipolar.

16. An integrated circuit, comprising:

an output stage, operatively connected to be controlled by said amplifier stages, and comprising the series combination of a pull-up transistor and a pull-down transistor connected to drive an output node therebetween;

a voltage-increasing stage, connected to generate an increased voltage output from a power supply input;

a connection for an integrating capacitor, separated from said output node by a diode, and operatively connected to said increased voltage from said voltage-increasing stage; and a negative feedback circuit, operatively connected to mirror the current charging said integrating capacitor to limit the current provided by said pull-up transistor when said capacitor is discharged.

17. The integrated circuit of claim 16, wherein said negative feedback circuit mirrors the current charging said capacitor to provide a current contribution to the base current of said pull-up transistor.

18. The integrated circuit of claim 16, further comprising at least one on-chip power MOS transistor having a gate terminal connected to be selectively driven by said increased voltage.

19. The integrated circuit of claim 16, wherein said voltage-increasing circuit is a voltage-boosting circuit using an external inductor.

20. The integrated circuit of claim 16, wherein said integrating capacitor is not integrated with said pull-up and pull-down transistors.

21. The integrated circuit of claim 16, wherein said pull-up and pull-down transistors are both bipolar.

22. The integrated circuit of claim 16, wherein said pull-up transistor is PNP and said pull-down transistor is NPN.

* * * * *